(12) United States Patent
Wang et al.

(10) Patent No.: US 11,721,390 B2
(45) Date of Patent: Aug. 8, 2023

(54) DRAM WITH INTER-SECTION, PAGE-DATA-COPY SCHEME FOR LOW POWER AND WIDE DATA ACCESS

(71) Applicant: Piecemakers Technology, Inc., Hsinchu (TW)

(72) Inventors: Gyh-Bin Wang, Hsinchu County (TW); Tah-Kang Joseph Ting, Hsinchu County (TW); Ming-Hung Wang, Hsinchu (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 17/568,736

(22) Filed: Jan. 5, 2022

(65) Prior Publication Data

US 2022/0130450 A1     Apr. 28, 2022

Related U.S. Application Data

(62) Division of application No. 17/037,755, filed on Sep. 30, 2020, now Pat. No. 11,250,904.

(51) Int. Cl.
| | |
|---|---|
| *G11C 7/18* | (2006.01) |
| *G11C 11/4096* | (2006.01) |
| *G11C 11/4094* | (2006.01) |
| *G11C 11/408* | (2006.01) |
| *G11C 11/4091* | (2006.01) |
| *G11C 5/05* | (2006.01) |

(52) U.S. Cl.
CPC ...... *G11C 11/4096* (2013.01); *G11C 11/4094* (2013.01); *G11C 5/05* (2013.01); *G11C 11/4085* (2013.01); *G11C 11/4091* (2013.01)

(58) Field of Classification Search
CPC ... G11C 11/4096; G11C 11/4094; G11C 5/05; G11C 11/4085; G11C 11/4091; G11C 7/18; G11C 7/12
See application file for complete search history.

(56) References Cited

U.S. PATENT DOCUMENTS

| | | | |
|---|---|---|---|
| 5,822,261 | A | 10/1998 | Suh |
| 6,151,242 | A * | 11/2000 | Takashima ............ G11C 11/22 365/230.03 |
| 6,198,682 | B1 | 3/2001 | Proebsting |
| 6,426,560 | B1 | 7/2002 | Kawamura |
| 8,812,777 | B2 | 8/2014 | Cha |
| 9,767,919 | B1 * | 9/2017 | He .................... G11C 29/38 |

(Continued)

*Primary Examiner* — Mushfique Siddique
(74) *Attorney, Agent, or Firm* — Winston Hsu (57) ABSTRACT

Voltages loaded onto the bit lines in a first CA section of a memory array can be latched by enabling the BLSA between the first section and a second section adjacent to the first section causing latched voltages to propagate to bit lines in the second section. Voltages propagated to the bit lines in the second section using the latches between the second section and a third section. Voltages can be propagated sequentially from section to subsequent adjacent section until a target location is reached. The scheme can be applied as a method of page-data write access in a memory chip, of which page data can be propagated sequentially from section to subsequent adjacent section until a target location is reached, and then, activating a word line in a section of the memory comprising the target location to write voltages to the memory cells at the target location.

17 Claims, 10 Drawing Sheets

(56) References Cited

U.S. PATENT DOCUMENTS

| | | |
|---|---|---|
| 9,870,833 B2 | 1/2018 | Lim |
| 10,403,389 B2 | 9/2019 | Lovett |
| 10,497,428 B2 | 12/2019 | Kim |
| 11,183,231 B2 | 11/2021 | Wang |
| 2002/0093864 A1* | 7/2002 | Ooishi .................... G11C 7/18 |
| | | 365/222 |
| 2003/0086288 A1 | 5/2003 | Sekiguchi |
| 2006/0023534 A1* | 2/2006 | Do ...................... G11C 11/4091 |
| | | 365/205 |
| 2006/0069851 A1 | 3/2006 | Chung |
| 2008/0285361 A1 | 11/2008 | Kim |
| 2009/0168576 A1* | 7/2009 | Fujita ................. G11C 11/4091 |
| | | 365/207 |
| 2011/0069568 A1 | 3/2011 | Shin |
| 2016/0284390 A1* | 9/2016 | Tomishima ......... G11C 11/4091 |
| 2019/0042199 A1 | 2/2019 | Sumbul |

\* cited by examiner

DRAM WITH INTER-SECTION, PAGE-DATA-COPY SCHEME FOR LOW POWER AND WIDE DATA ACCESS

CROSS REFERENCE TO RELATED APPLICATIONS

This divisional application claims priority of U.S. patent application Ser. No. 17/037,755, filed on 30 Sep. 2020, included herein by reference in its entirety.

BACKGROUND OF THE INVENTION

1. Field of the Invention

The present invention is related to memory management, and more particularly, to an apparatus for enhancing prefetch access in a memory module, for example, using a low power and wide data access page-data-copy scheme with aid of partial memory architecture of the memory module.

2. Description of the Prior Art

A memory such as a Dynamic Random Access Memory (DRAM) may be arranged to store user data, and maximizing a goal of high bandwidth access may be regarded as one of some important considerations regarding DRAM design. However, some problems may occur in prior art schemes of data access. For example, there may be a tradeoff between a prefetch number and the bank area. More particularly, without significantly increasing the bank area, conventional cell array architecture of a DRAM chip may have reached a limitation of the prefetch number. Thus, a novel architecture and method of data access is needed for solving the problem.

SUMMARY OF THE INVENTION

A novel method of page-data read access in a memory bank is proposed. The memory comprises a plurality of banks, each bank comprises a plurality of sections, each section comprising a plurality of memory cells coupled by a word line, each memory cell respectively coupled to a different bit line substantially perpendicular to the word line, each bit line electrically coupled or selectively electrically coupled to a bit line in an adjacent section via a latch, the method comprises:

A word line is activated in a first section of a memory bank to load voltages present in the memory cells of the first section respectively onto the bit lines in the first section. Voltages loaded onto the bit lines in the first section are latched using latches between the first section and a second section adjacent to the first section causing latched voltages to propagate to bit lines in the second section. Voltages propagated to the bit lines in the second section are latched using latches between the second section and a third section different from the first section and adjacent to the second section causing the latched voltages to propagate to bit lines in the third section. Continue to propagate voltages sequentially from section to subsequent adjacent section until bit lines at an end of the memory bank are reached, and reading the voltages from the bit lines at the end of the memory bank.

A novel method of page-data write access in a memory bank is proposed. The memory comprises a plurality of banks, each bank comprising a plurality of sections, each section comprising a plurality of memory cells coupled by a word line, each memory cell respectively coupled to a different bit line substantially perpendicular to the word line, each bit line electrically coupled or selectively electrically coupled to a bit line in an adjacent section via a latch. The method comprises writing voltages respectively onto bit lines. Voltages written onto the bit lines are latched using latches between a first section comprising bit lines and a second section adjacent to the first section causing latched voltages to propagate to bit lines in the second section. Voltages propagated to the bit lines in the second section are latched using latches between the second section and a third section different from the first section and adjacent to the second section causing the latched voltages to propagate to bit lines in the third section. Continue to propagate voltages sequentially from section to subsequent adjacent section until bit lines at a target section are reached. A word line, then, is activated in the section of the memory bank comprising the target section to write voltages propagated to the target section to the memory cells at the target location.

A novel method of page-data access in a memory bank is proposed.

The memory bank includes a plurality of memory banks, each bank comprising a plurality of sections, each memory section comprising a plurality of memory cells coupled by a word line. Each memory cell having 1T1C or 2T2C architecture is respectively coupled to a first latch and a second latch external to the memory cell. For a 2T2C architecture, each memory cell is coupled to a pair of bit lines that are merged or shorten to become one bit line, each bit line, then, can respectfully be coupled to two latches located at opposite ends of the bit line. For a 1T1C architecture, each memory cell is coupled to two latches located at the opposite ends of the bit line through a pair of selective pass transistors associated with the two latches.

A novel memory bank capable of page-data access is proposed. The memory bank has a plurality of memory sections, each memory section comprising a plurality of memory cells coupled by a word line, each memory cell respectively coupled to a bit line substantially perpendicular to the word line. For the implementation of this page-copy access scheme with a 2T2C cell array, a latching module is coupled respectively between each merged bit line in one memory section and a corresponding merged bit line in an adjacent memory section. For the implementation of this page-copy access scheme with a 1T1C cell array, each latching module comprises four transistors, each transistor has a first terminal, a second terminal, and a control terminal. A first bit line in the one memory section is coupled to the first terminal of the first transistor, the second terminal of the first transistor, a first node, the first terminal of the second transistor, the second terminal of the second transistor, and a first bit line in the adjacent memory section in series. A second bit line in the one memory section is coupled to the first terminal of the third transistor, the second terminal of the third transistor, a second node, the first terminal of the fourth transistor, the second terminal of the fourth transistor, and a second bit line in the adjacent memory section in series. A latch is coupled to the first node and to the second node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
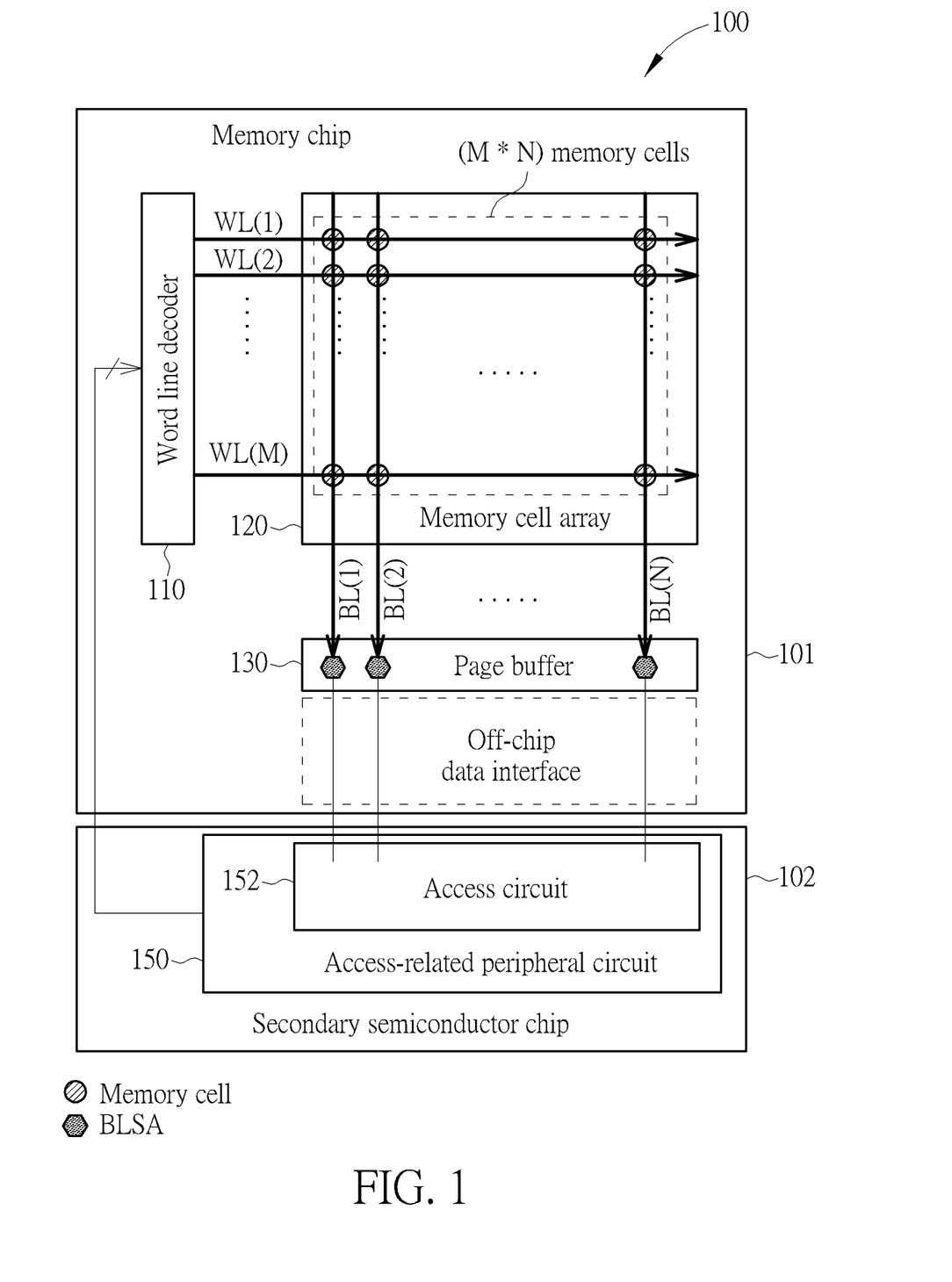
FIG. 1 is a diagram of an apparatus for enhancing data access in a memory module according to an embodiment of the present invention

FIG. 1 is a diagram of an apparatus for enhancing data access (e.g. read/write/move) in a memory (e.g. a DRAM, etc.) module 100 according to an embodiment of the present invention, where the apparatus may comprise at least one portion (e.g. a portion or all) of the memory module 100. For example, the apparatus may comprise partial memory architecture of the memory module 100. For another example, the apparatus may comprise a combination of the partial memory architecture and associated control mechanism. For yet another example, the apparatus may comprise the whole of the memory module 100.

As shown in FIG. 1, the memory module 100 may comprise a memory bank 101 and a secondary semiconductor chip 102, and the memory bank 101 may comprise a word line decoder 110, a memory cell array 120 comprising a plurality of memory cells such as (M*N) memory cells (e.g. M and N may represent positive integers, respectively), and a plurality of bit lines and a plurality of word lines that are respectively coupled to the memory cell array 120, such as N bit lines {BL(1), BL(2), ..., BL(N)} and M word lines {WL(1), WL(2), ..., WL(M)} coupled to the (M*N) memory cells, but the present invention is not limited thereto. According to some embodiments, except for word line drivers, the word line decoder 110 can be, in part at least, implemented in the secondary semiconductor chip 102. For example, a word line decoder pre-stage of the word line decoder 110 may be implemented on the secondary semiconductor chip 102 and a word line decoder end-stage (which may comprise the word line drivers) of the word line decoder 110 may be implemented on the memory bank 101.

The memory bank 101 may further comprise a plurality of bit-line sense amplifiers (BLSAs) coupled to the memory cell array 120 through the plurality of bit lines, respectively, such as N BLSAs of a page buffer 130, and a plurality of main data lines coupled to the N BLSAs of the page buffer 130, where the plurality of main data lines may serve as an off-chip data interface of the memory bank 101. For example, the secondary semiconductor chip 102 may be electrically connected to the memory bank 101 through direct face-to-face attachment, but the present invention is not limited thereto. In addition, the secondary semiconductor chip 102 may comprise an access-related peripheral circuit 150, and the access-related peripheral circuit 150 may comprise an access circuit 152. For example, the secondary semiconductor chip 102 may comprise a plurality of secondary amplifiers positioned in the access circuit 152.

The memory cell array 120 may be arranged to store data for a host system (not shown), and the memory module 100 may be installed in the host system. Examples of the host system may include, inter alia, a multifunctional mobile phone, a tablet computer, and a personal computer such as a desktop computer and a laptop computer. The plurality of bit lines such as the N bit lines {BL(1), BL(2), ..., BL(N)} and the plurality of word lines such as the M word lines {WL(1), WL(2), ..., WL(M)} may be arranged to perform access control of the memory cell array 120. According to this embodiment, the plurality of BLSAs may be arranged to sense a plurality of bit-line signals restored from the plurality of memory cells such as the (M*N) memory cells, and convert the plurality of bit-line signals into a plurality of amplified signals, respectively.

Some implementation details regarding the access control of the memory cell array 120 may be described as follows. According to some embodiments, the word line decoder 110 may decode an access control signal thereof (e.g. a row select signal) to determine whether to select (e.g. activate) a row of memory cells corresponding to a word line WL(m) (e.g. the index "m" may represent an integer falling within the interval [0, M]), where the word line decoder 110 may play a role of a row decoder regarding the access control of the memory cell array 120.

Regarding the architecture shown in FIG. 1, the apparatus may comprise the memory bank 101 that is positioned in the memory module 100, but the present invention is not limited thereto. For example, the apparatus may further comprise the secondary semiconductor chip 102. According to some embodiments, in addition to the memory bank 101, the memory module 100 may comprise at least one portion (e.g. a portion or all) of the secondary semiconductor chip 102. For example, one or more other circuits with any functionalities outside the memory module 100 may be integrated into the secondary semiconductor chip 102.

According to some embodiments, the architecture shown in FIG. 1 may vary. For example, the memory cell array 120 may be divided into a plurality of cell array (CA) sections according to a predetermined bit-line length, for enhancing the access speed, and the plurality of BLSAs (e.g. the N BLSAs in the page buffer 130) may be divided into a plurality of BLSA sections coupled to the plurality of cell array sections, correspondingly, for performing the associated sensing operations.

Figure 2:
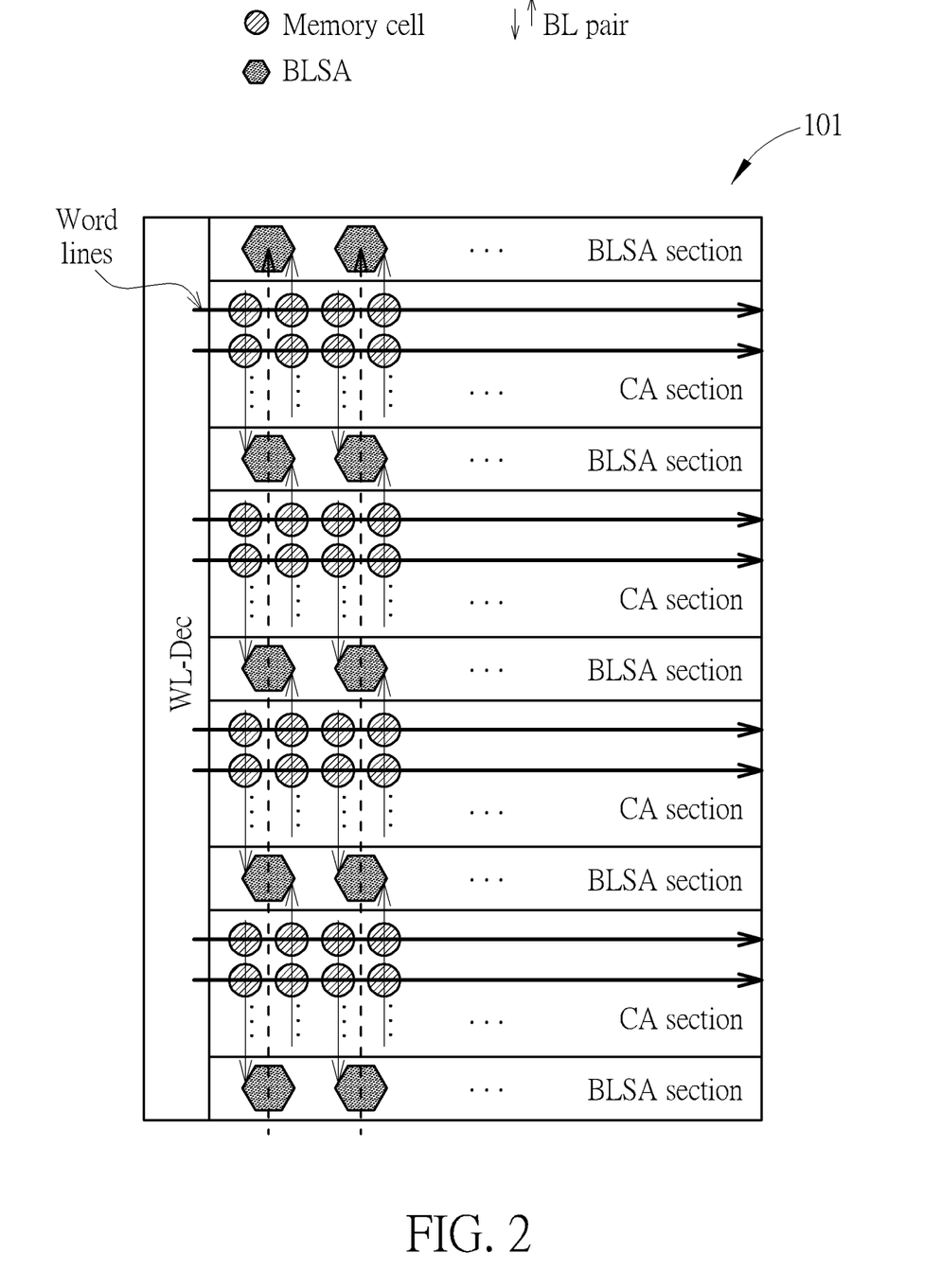
FIG. 2 illustrates some cell array sections alternating with some BLSA sections of the memory module shown in FIG. 1 according to an embodiment of the present invention.

FIG. 2 illustrates some cell array sections alternating with some BLSA sections of the memory module shown in FIG. 1 according to an embodiment of the present invention. The CA sections and the BLSA sections in the architecture shown in FIG. 2 may be taken as examples of the plurality of cell array sections and the plurality of BLSA sections mentioned above. In addition, any two of the CA sections may be the same or similar to each other, and any two of the BLSA sections may be the same or similar to each other.

Figure 3:
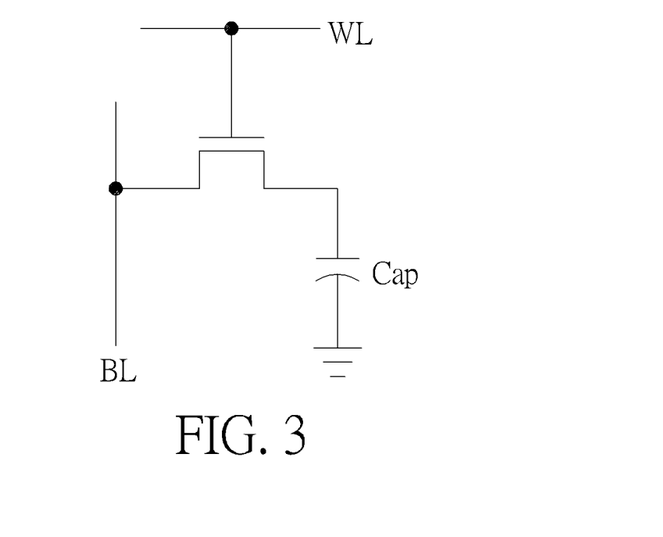
FIG. 3 illustrates a 1T1C memory cell of the memory module shown in FIG. 1 according to an embodiment of the present invention.

FIG. 3 illustrates a 1T1C (one transistor, one capacitor) memory cell (for example, in a form of DRAM cell) of the memory module 100 shown in FIG. 1 according to an embodiment of the present invention. This memory cell may be taken as an example of any memory cell (e.g. each memory cell) of the plurality of memory cells of the memory cell array 120. As shown in FIG. 3, the memory cell may comprise a switch (e.g. a transistor such as a Metal Oxide Semiconductor Field Effect Transistor (MOSFET)) coupled to a certain word line (WL) (e.g. the word line WL(m)) of the plurality of word lines and a certain bit line (BL) (e.g. the bit line BL(n)) of the plurality of bit lines, and comprise a capacitor Cap. The capacitor Cap may be arranged to store electric charge, and different states of the electric charge may indicate a bit of information (e.g. 0 or 1), but the present invention is not limited thereto. Some embodiments may also utilize a 2T2C (two transistor, two capacitor) memory cell to increase reliability. Those in the art know normal structure and functioning of a 2T2C memory cell.

Figure 4:
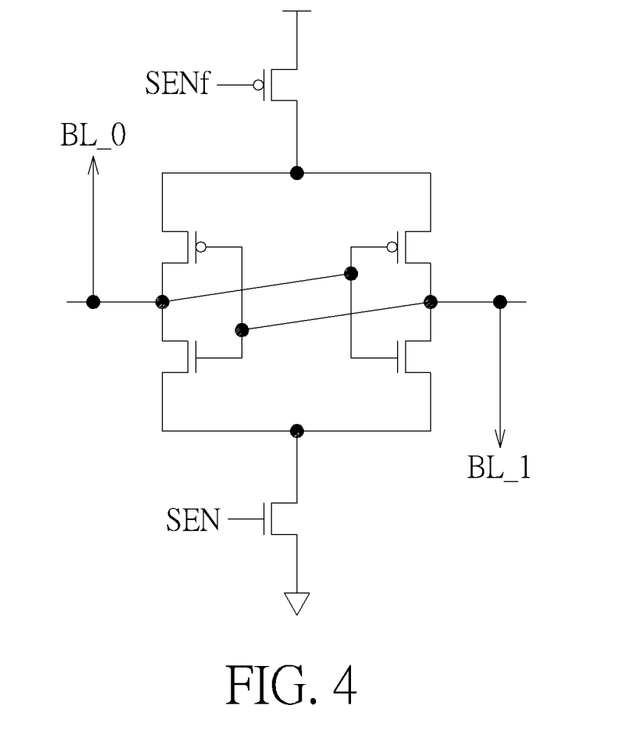
FIG. 4 illustrates a BLSA of the memory module shown in FIG. 1 according to an embodiment of the present invention.

FIG. 4 illustrates a BLSA of the memory module 100 shown in FIG. 1 according to an embodiment of the present invention. As shown in FIG. 4, the BLSA may be considered a latch and comprise two cross-connected inverters. More particularly, the two cross-connected inverters may each be coupled to two bit lines (labeled "BL_0" and "BL_1" for better comprehension) of the plurality of bit lines. The two bit lines may be respectively coupled to different memory cells of different CA sections (e.g. two CA sections adjacent to a certain BLSA section comprising this BLSA), and may be taken as an example of any BL pair of the BL pairs mentioned above. Each inverter of the inverters may be driven between a set of driving signals such as two driving signals SENf and SEN.

The BLSA may operate according to the two driving signals SENf and SEN, to obtain respective bit information (voltages), respectively, where the memory module 100 (e.g. the memory bank 101) may select any of the plurality of memory cells according to the access control signals of the word line decoder 110. For example, in a first phase of a read phase, the BLSA may obtain the bit information of a memory cell through the BL_0, and more particularly, amplify a signal carrying the bit information of the memory cell. For another example, in a second read phase of these read phases, the BLSA may obtain the bit information of a second memory cell of the two memory cells through the second bit line such as BL_1, and more particularly, amplify a second signal carrying the bit information of the second memory cell.

Control of the BLSAs is managed by the two driving signals SENf and SEN. Because the application is directed toward movement of data a page at a time, where a page is defined as data stored in all memory cells activated by a same single word line, column select lines and data lines are not necessary, saving costs, chip area, and complexity. Instead, by sequentially activating adjacent BLSA sections, data present in a first BLSA will be copied to a next sequential BLSA. In embodiments of the application, a page of data can be propagated from a source location to a target location in either direction perpendicular to the word lines.

For example, voltages loaded onto the bit lines in a first CA section can be latched by enabling the BLSA between the first section and a second section adjacent to the first section causes latched voltages to propagate to bit lines in the second section. Voltages propagated to the bit lines in the second section using the latches between the second section and a third section different than the first section and adjacent to the second section cause the latched voltages to propagate to bit lines in the third section. Using this method of sequentially activating BLSAs, voltages can be propagated sequentially from section to subsequent adjacent section until a target location is reached. Voltages can be loaded onto the bit lines by activating the appropriate word line to read source voltages or source voltages may be provided by the data access circuit 152.

Thus, a read activates the word line at the source location loading voltages from the memory cells at the source location onto the corresponding bit lines where they may be latched through activation of the adjacent BLSA. From there, voltages can be propagated sequentially from section to subsequent adjacent section until a target location is reached, whether the target location is the data access circuit 152 or another CA section in the case of a move. A move and/or a write requires activation of the word line of the target section once the data has been moved to the bit lines of that target section to store the data into the associated memory cells.

Figure 5:
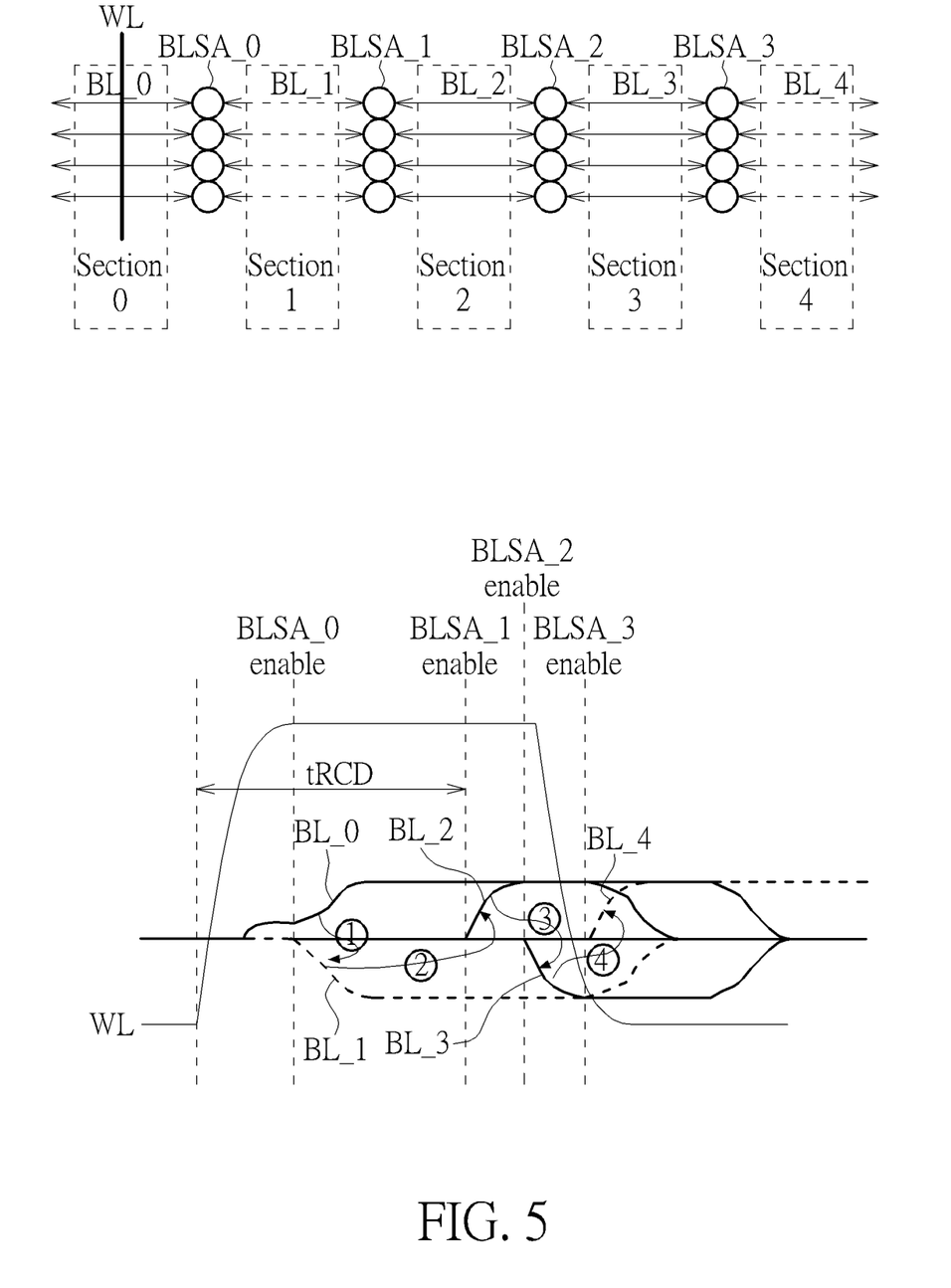
FIG. 5 illustrates an inter-section page-data-copy scheme according to some embodiments.

FIG. 5 illustrates the disclosed inter-section page-data-copy scheme according to some embodiments. The top half of FIG. 5 shows a functional view of a portion of an example memory bank. The CA sections are outlined in dotted lines and numbered 0-4. Each CA section contains a word line, although only one is shown in FIG. 5. A BLSA section BLSA_0-BLSA_3 is disposed between each of the CA sections, and each BLSA is connected to the adjacent CA sections via bit lines, shown here as BL_0-BL_3.

As shown in FIG. 5, after BLSA_0 is enabled (i.e. SENf-0v, SEN-VDD), page data is sensed out from the cells of an open word line and also copied from CA section 0 to CA section 1 (identified in the figure by a circled number 1). Then, after BLSA_1 is enabled, page data is copied from CA section 1 to CA section 2 (identified in the figure by a circled number 2). Next, after BLSA_2 is enabled, page data is copied from CA section 2 to CA section 3 (identified in the figure by a circled number 3). Finally, after BLSA_3 is enabled, page data is copied from CA section 3 to CA section 4 (identified in the figure by a circled number 4).

Figure 6A:
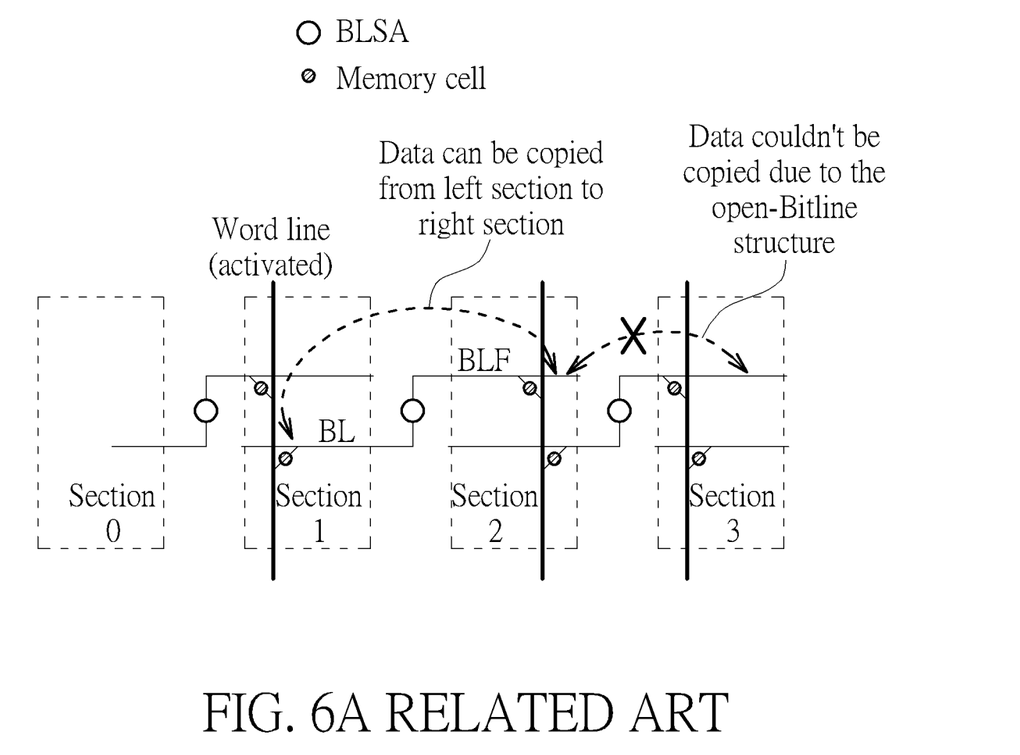
FIGS. 6a and 6b illustrate data copy in a conventional open-bit-line array of memory sections alternating between 1T1C architecture and 2T2C architecture.
Figure 6B:
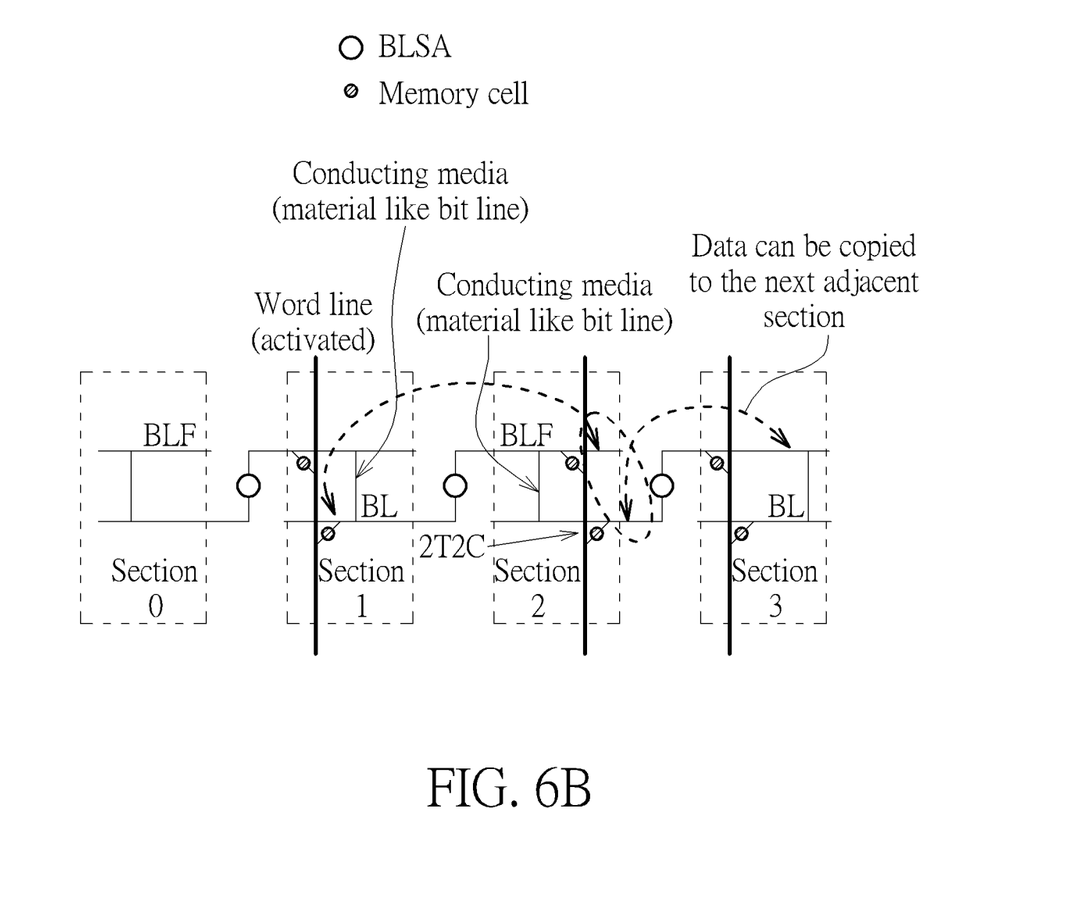

FIGS. 6a and 6b illustrate data copy in a conventional open-bit-line array of memory sections alternating between 1T1C architecture and 2T2C architecture. The disclosed data copy scheme may fail (for example from CA section 2 to CA section 3 in FIG. 6a) in the conventional open-bit-line array shown in FIG. 6a because the data cannot always be copied due to the open-bit-line structure. To solve this problem, FIG. 6b shows a structural modification of the open-bit-line array by forming an electrical link connecting the first and second bit lines in each memory cell. This modification ensures that the data stored in a preceding BLSA will always be available to a subsequent BLSA regardless of whether the data is present on the bit line BLF or BL because it will always be present on both.

Figure 7A:
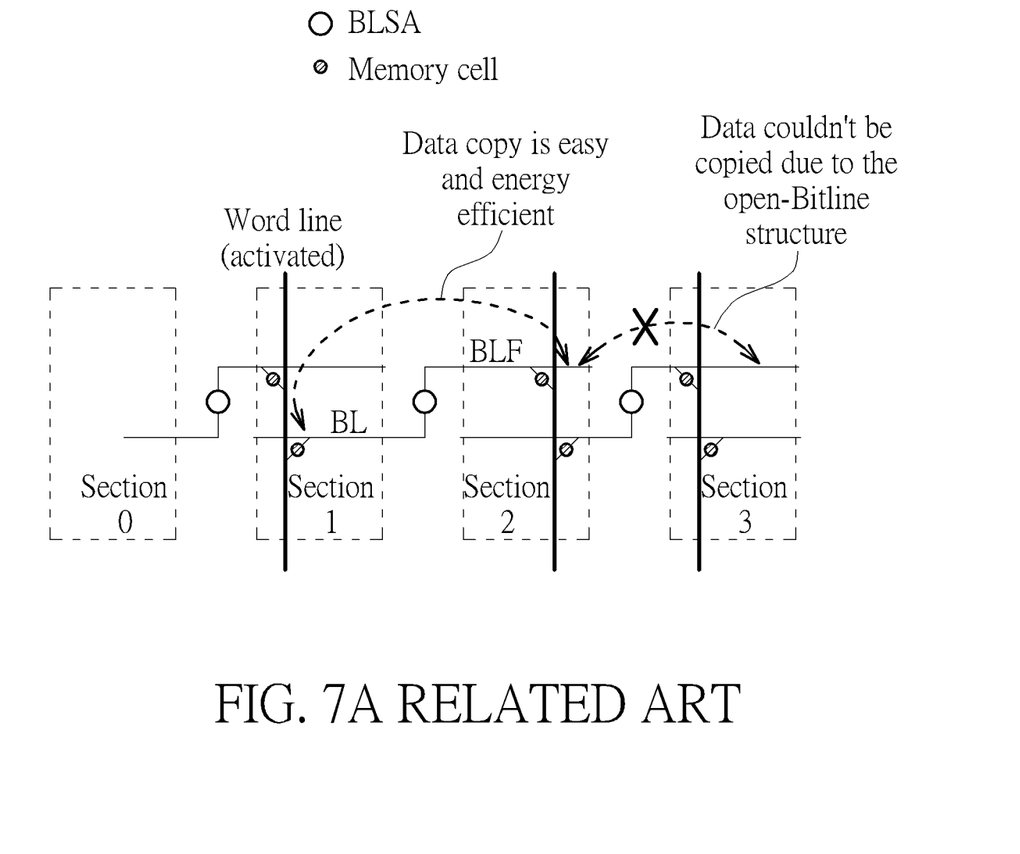
FIGS. 7a and 7b illustrate data copy in another conventional open-bit-line array of memory sections.
Figure 7B:
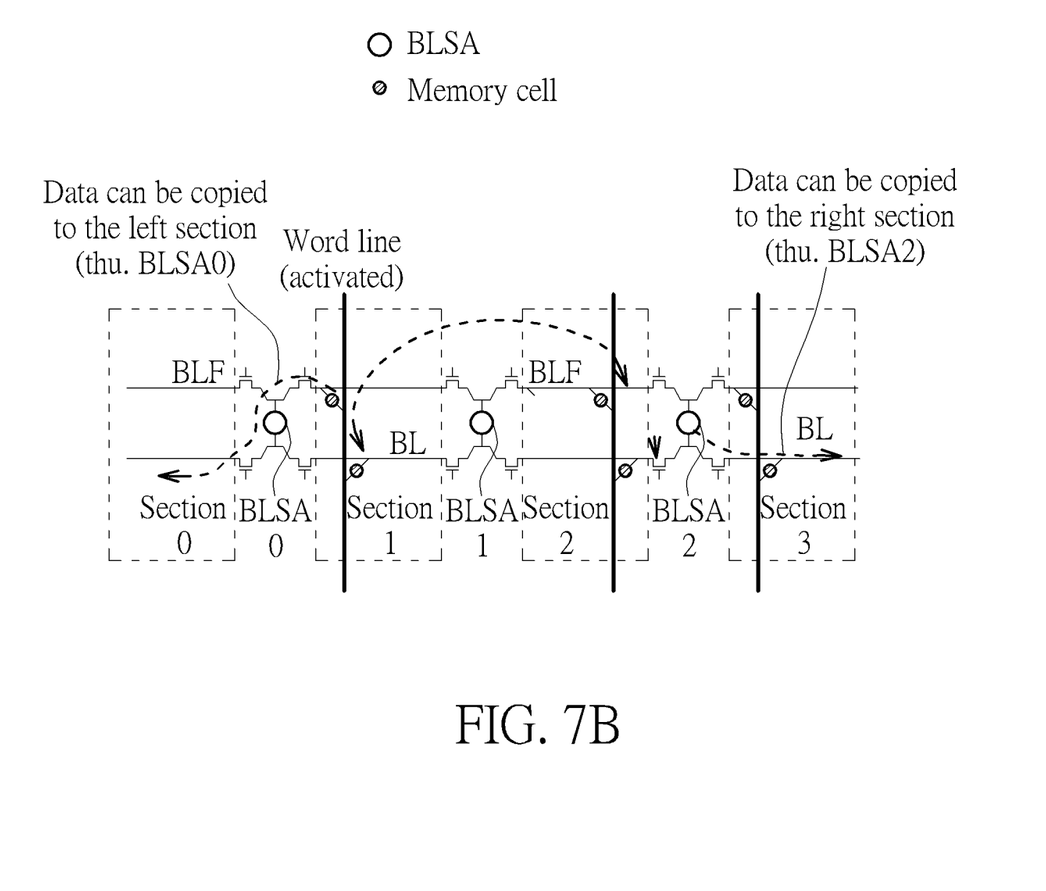

FIGS. 7a and 7b illustrate data copy in another conventional open-bit-line array of memory sections. As with the previous embodiment of FIG. 6a/6b, the disclosed data copy scheme may fail (for example from CA section 2 to CA section 3 in FIG. 7a) in the conventional open-bit-line array shown in FIG. 7a because the data cannot always be copied due to the open-bit-line structure. To solve this problem, FIG. 7b shows another possible structural modification of the open-bit-line array. In FIG. 7b, each BLSA is connected to four transistors, each transistor having a first terminal, a second terminal, and a control terminal. A first bit line in one memory section is coupled to the first terminal of the first transistor, the second terminal of the first transistor, a first node, the first terminal of the second transistor, the second terminal of the second transistor, and a first bit line in the adjacent memory section in series as shown in FIG. 7b. A second bit line in the one memory section is coupled to the first terminal of the third transistor, the second terminal of the third transistor, a second node, the first terminal of the fourth transistor, the second terminal of the fourth transistor, and a second bit line in the adjacent memory section in series, and a BLSA is coupled to the first node and to the second node also as shown in FIG. 7b. Each of the four transistors can be controlled to electrically connect the BLSA with bit lines BLF and BL in the adjacent CA sections, ensuring the desired propagation of data voltages.

Figure 8:
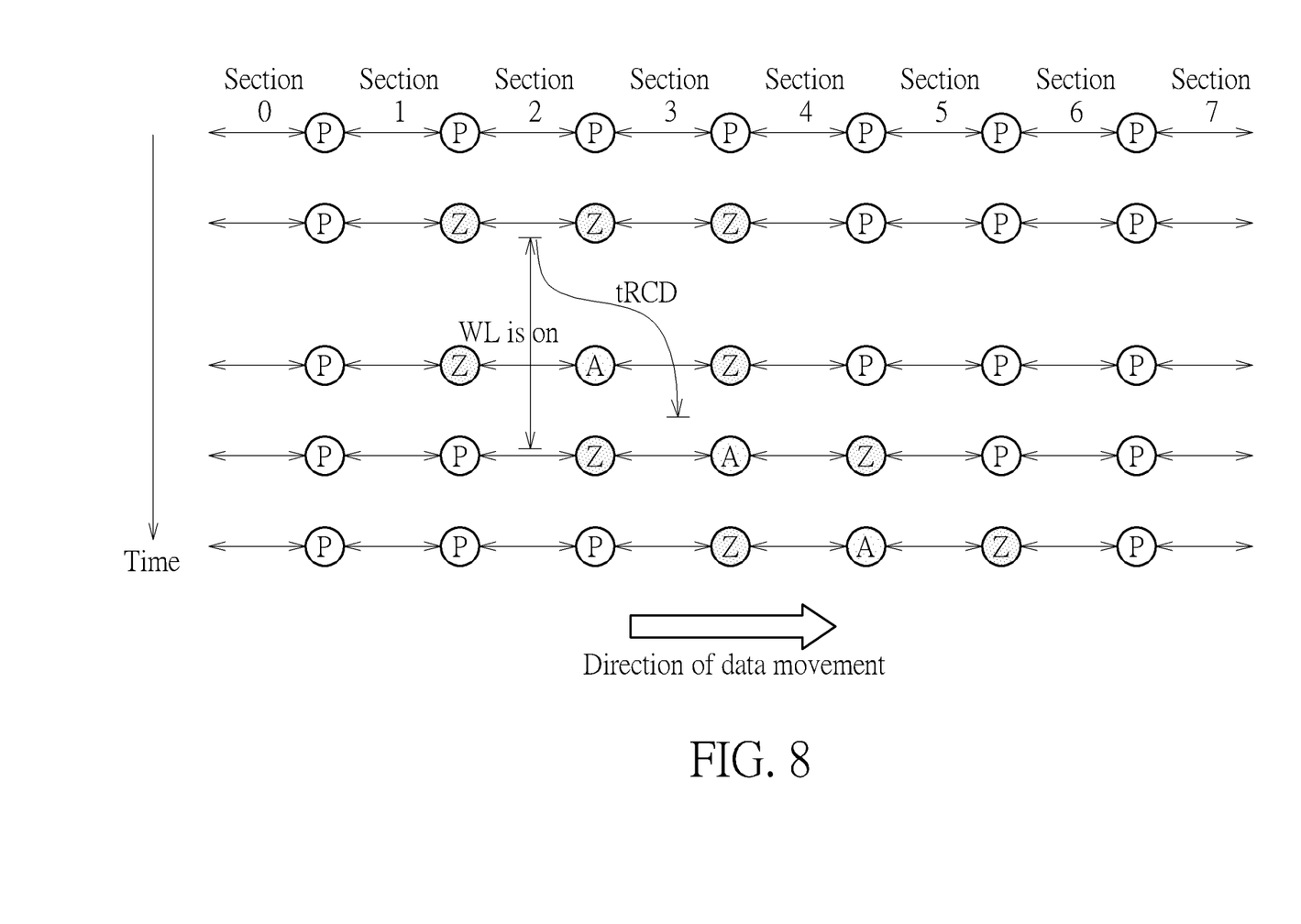
FIG. 8 shows an example operation of a data copy in a conventional open-bit-line array with inter-sectional movement of page data.

FIG. 8 shows an example operation of a data copy in a conventional open-bit-line array with inter-sectional movement of page data. In FIG. 8, time shifts from top to bottom in the drawing, and data is copied from the left to the right as time progresses. In FIG. 8, after precharging the memory cells in CA section 2, the word line in CA section 2 is activated, reading and amplifying data from the memory cells and latching the data (labeled as "A" in the drawings) in the appropriate BLSA. As shown, the word line can then be turned off. When the subsequent BLSA is activated, the data "A" is copied from the current BLSA to the subsequent BLSA as shown. The BLSA activation process continues, propagating the data "A" from one BLSA to a next BLSA until a target location is reached.

Some of the benefits of this page-copy scheme include:

Harvesting the maximum pre-fetch of data a DRAM array can provide.

Potentially discarding the use of data line sense amplifiers and saving the power consumption of an unnecessary column select line decoder.

Power savings due to the inherent voltage half swing for bit lines BL and BLF.

Accommodating a BL-before-WL page-data write scheme to achieve very fast and low-power data writing.

Figure 9:
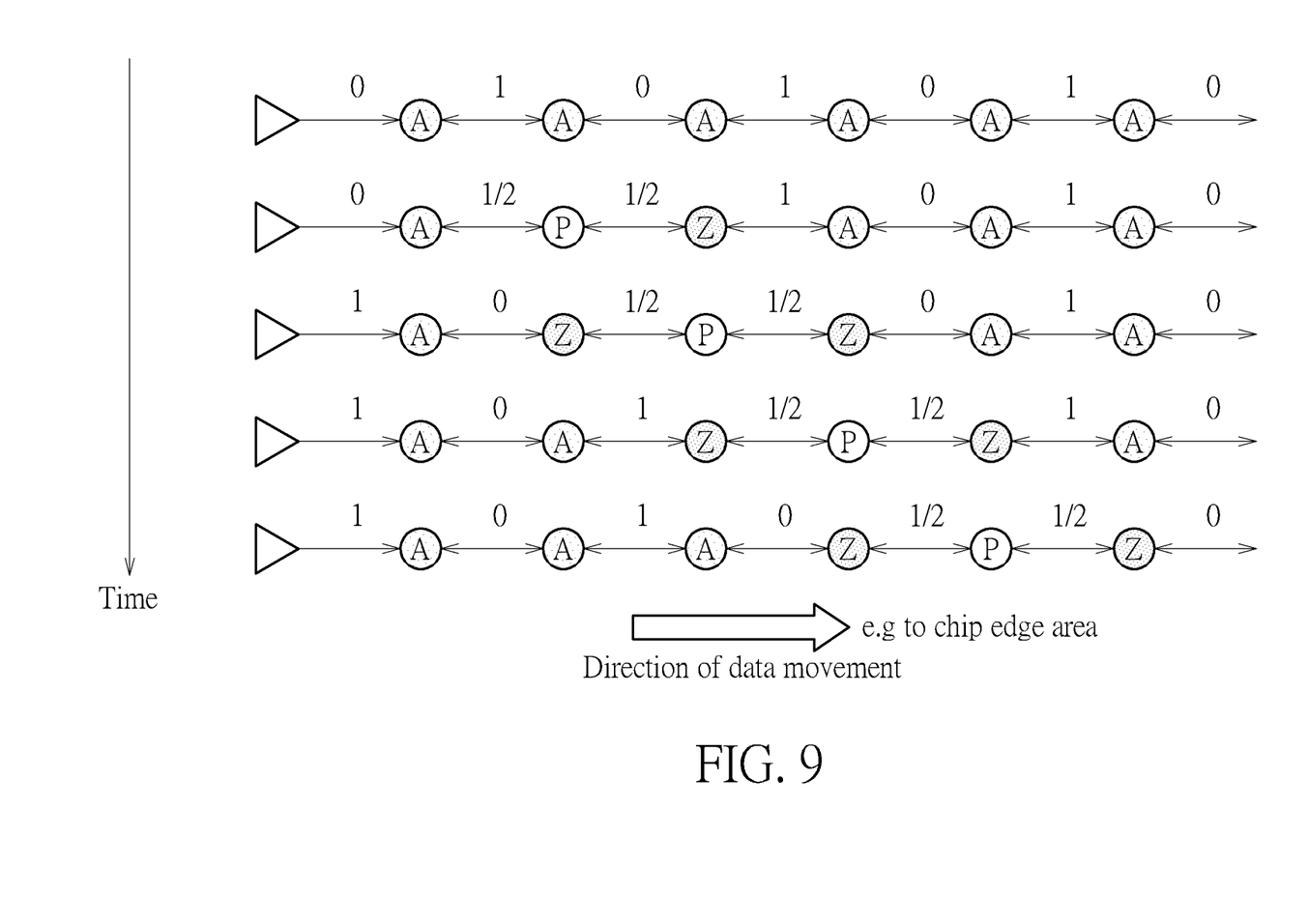
FIG. 9 illustrates application of the array data access scheme to a bank peripheral.

FIG. 9 illustrates application of the array data access scheme to a chip peripheral—the long-range, wide-bus, power-efficiency data movement scheme.

FIG. 9 is similar in notation to FIG. 8, except that FIG. 9 shows the voltage values being propagated across the BLSAs. Because the BLSA amplifies a read value and effectively reproduces it as either a "1" or a "0", due to precharging of the circuits to ½ VDD, voltages being propagated have a maximum swing of ½ as seen in the figure.

This feature provides benefits compared with a CMOS repeated of data being copied/moved to the chip edge area with a ½ voltage swing. Compared with the traditional small swing IF, here there is no DC current consumption from a receiver for receiving the small swing signal, yet is as robust as a fully differential IF (no Vref or ½ $V_{IF}$ need as in small swing IF.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for row/page data accessing in a memory chip, the apparatus comprising:
   a plurality of memory banks, each memory bank comprising a plurality of memory sections, each memory section comprising a plurality of memory cells coupled by a word line, each memory cell of a memory section having a bit line electrically coupled or selectively electrically coupled to a bit line of a memory cell in an adjacent memory section via a first latch module located at an end of the bit line and electrically coupled or selectively electrically coupled to a bit line of another memory cell in another adjacent memory section via a second latch module located at another end of the bit line; and continuously the bit line of the memory cell of the adjacent memory section being coupled to a bit line in a next memory section through a next propagating latch module until a bit line at a target memory section of the memory bank is reached; and
   a propagating control unit and a routing control unit, coupled to the latch module of each memory section, and arranged to perform signal propagating through bit lines;
   wherein a first bit line in a first memory section is coupled to a first terminal of a first switch of the first latch module, a second terminal of the first switch of the first latch module is coupled to a latch circuitry of the first latch module, the latch circuitry of the first latch module is coupled to a first terminal of a fourth switch of the first latch module, and a second terminal of the fourth switch of the first latch module is coupled to a second bit line in a second memory section;
   the second bit line in the second memory section is coupled to a first terminal of a third switch of the second latch module, a second terminal of the third switch of the second latch module is coupled to a latch circuitry of the second latch module, the latch circuitry of the second latch module is coupled to a first terminal of a second switch of the second latch module, and a second terminal of the second switch of the second latch module is coupled to a first bit line in a third memory section; and
   the routing control unit is coupled to the first switch of the first latch module, the fourth switch of the first latch module, the second switch of the second latch module, and the third switch of the second latch module for propagating data stored in a first memory cell of the first memory section from the first bit line in the first memory section to the second bit line in the second memory section through the first switch of the first latch module, the latch circuitry of the first latch module, and the fourth switch of the first latch module, and propagating the data stored in the first memory cell of the first memory section from the second bit line in the second memory section to the first bit line in the third memory section through the third switch of the second latch module, the latch circuitry of the second latch module, and the second switch of the second latch module.

2. The apparatus for row/page data accessing in the memory chip of claim 1, wherein
   a first terminal of the second switch of the first latch module is coupled to the latch circuitry of the first latch module, a second terminal of the second switch of the first latch module is coupled to a first bit line in the second memory section, a second bit line in the first memory section is coupled to a first terminal of a third switch of the first latch module, a second terminal of the third switch of the first latch module is coupled to the latch circuitry of the first latch module;
   the first bit line in the second memory section is coupled to a first terminal of a first switch of the second latch module, a second terminal of the first switch of the second latch module is coupled to the latch circuitry of the second latch module, the latch circuitry of the second latch module is further coupled to a first terminal of a fourth switch of the second latch module, and a second terminal of the fourth switch of the second latch module is coupled to a second bit line in the third memory section;
   the routing control unit is coupled to the third switch of the first latch module, the second switch of the first latch module, the first switch of the second latch module, and the fourth switch of the second latch module for propagating data stored in a second memory cell of the first memory section from the second bit line in the first memory section to the first bit line in the second memory section through the third switch of the first latch module, the latch circuitry of the first latch module, and the second switch of the first latch module, and propagating the data stored in the second memory cell of the first memory section from the first bit line in the second memory section to the second bit line in the third memory section through the first switch of the second latch module, the latch circuitry of the second latch module, and the fourth switch of the second latch module.

3. The apparatus for row/page data accessing in the memory chip of claim 2, wherein the routing control unit programs a routing path with the first switch and the fourth switch of the first latch module being fixed on, and the second switch and the third switch of the first latch module being fixed off; the second switch and the third switch of the second latch module being fixed on, the first switch and fourth switch of the second latch module being fixed off; and the first switch and the fourth switch of a third latch module being fixed on, and the second switch and the third switch of the third latch module being fixed off; and continuously applied to subsequent propagating latch modules until a last latch module at an edge of the memory bank by a toggling way.

4. The apparatus for row/page data accessing in the memory chip of claim 3, wherein any of the fixed-on switches is an electrical short path; and any of the fixed-off switches is an electrical open path.

5. The apparatus for row/page data accessing in the memory chip of claim 1, wherein each switch is composed of an N-type MOSFET or a P-type MOSFET or a complementary MOSFET transistor, wherein each transistor has a first terminal, a second terminal, and an on/off control terminal, wherein the routing control unit is coupled to the on/off control terminal.

6. The apparatus for row/page data accessing in the memory chip of claim 1, wherein the latch circuitry comprises two cross-connected inverters, wherein each inverter of the inverters is driven between a first transistor coupled to power and a second transistor coupled to ground, and wherein the propagating control unit is coupled to the first (power-connected) transistor and the second (ground-connected) transistor for controlling operations of the power transistor and the ground transistor.

7. An apparatus for row/page data accessing in a memory chip, the apparatus comprising:
a plurality of memory banks, each bank comprising a plurality of sections, each memory section comprising a plurality of memory cells coupled by a word line, each memory cell of a section having a bit line electrically coupled or selectively electrically coupled to a bit line of a memory cell in an adjacent section via a first latch module located at an end of the bit line and electrically coupled or selectively electrically coupled to a bit line of another memory cell in another adjacent section via a second latch module located at another end of the bit line; and continuously the bit line of the memory cell of the adjacent memory section being coupled to a bit line in a next section through a next propagating latch module until a bit line at a target memory section of the memory bank is reached; and a propagating control unit and a routing control unit, coupled to the latch module of each memory section, and arranged to perform signal propagating through bit lines;
wherein a first bit line in a first memory section is coupled to a first terminal of a first switch of the first latch module, a second terminal of the first switch is coupled to a first terminal of a second switch of the first latch module and a latch circuitry of the first latch module, a second terminal of the second switch is coupled to a second bit line in the first memory section, a first bit line in a second memory section is coupled to a first terminal of a third switch of the first latch module, a second terminal of the third switch is coupled to a first terminal of a fourth switch of the first latch module and a latch circuitry of the first latch module, and a second terminal of the fourth switch is coupled to a second bit line in the second memory section; and
the latch circuitry comprises two cross-connected inverters, each inverter of the inverters is driven between a power transistor coupled to power and a ground transistor coupled to ground, the propagating control unit is coupled to the power transistor and the ground transistor for controlling operations of the power transistor and the ground transistor, and the routing control unit is coupled to the first switch, the second switch, the third switch and the fourth switch for controlling operations of the first switch, the second switch, the third switch and the fourth switch, thereby performing the signal propagating through the bit lines.

8. The apparatus for row/page data accessing in the memory chip of claim 7, wherein the routing control unit programs a routing path with the first switch and the third switch of all latch modules in the memory bank fixed on, and the second switch and the fourth switch of all latch modules in the memory bank fixed off.

9. The apparatus for row/page data accessing in the memory chip of claim 8, wherein any of the fixed-on switches is an electrical short path; and any of the fixed-off switches is an electrical open path.

10. The apparatus for row/page data accessing in the memory chip of claim 7, wherein the routing control unit programs a routing path with the first switch and the third switch of all latch modules in the memory bank being fixed off, and the second switch and the fourth switch of all latch modules in the memory bank being fixed on.

11. The apparatus for row/page data accessing in the memory chip of claim 10, wherein any of the fixed-on switches is an electrical short path; and any of the fixed-off switches is an electrical open path.

12. The apparatus for row/page data accessing in the memory chip of claim 7, wherein the routing control unit programs a routing path with the first switch and the fourth switch of the first latch module being fixed on, the second switch and the third switch of the first latch module being fixed off, a second switch and a third switch of the second latch module being fixed on, a first switch and a fourth switch of the second latch module being fixed off, a first switch and a fourth switch of a third latch module being fixed on, and a second switch and a third switch of the third latch module being fixed off; and continuously applied to subsequent propagating latch modules until a last latch module at an edge of the memory bank by a toggling way.

13. The apparatus for row/page data accessing in the memory chip of claim 12, wherein any of the fixed-on switches is an electrical short path; and any of the fixed-off switches is an electrical open path.

14. The apparatus for row/page data accessing in the memory chip of claim 7, wherein the first switch, the second switch, the third switch and the fourth switch of all latch modules in the memory bank are fixed on, to construct each memory cell having 2T2C architecture.

15. The apparatus for row/page data accessing in the memory chip of claim 14, wherein any of the fixed-on switches is an electrical short path; and any of the fixed-off switches is an electrical open path.

16. The apparatus for row/page data accessing in the memory chip of claim 7, wherein the switch circuitry is composed of an N-type MOSFET or a P-type MOSFET or a complementary MOSFET transistor, wherein each transistor has a first terminal, a second terminal, and an on/off control terminal, wherein the routing control unit is coupled to the on/off control terminal.

17. An apparatus for row/page data accessing in a memory chip, the apparatus comprising:

a plurality of memory banks, each memory bank comprising a plurality of memory sections, each memory section comprising a plurality of memory cells coupled by a word line, each memory cell of a memory section having a bit line electrically coupled or selectively electrically coupled to a bit line of a memory cell in an adjacent memory section via a first latch module located at an end of the bit line and electrically coupled or selectively electrically coupled to a bit line of another memory cell in another adjacent memory section via a second latch module located at another end of the bit line; and continuously the bit line of the memory cell of the adjacent memory section being coupled to a bit line in a next memory section through a next propagating latch module until a bit line at a target memory section of the memory bank is reached; and a propagating control unit, coupled to the latch module of each memory section, and arranged to perform the signal propagating through bit lines;

wherein a first bit line in a first memory section is coupled to a second bit line in the first memory section via a first conducting line, the second bit line in the first memory section is coupled to a latch circuitry of the first latch module, the latch circuitry of the first latch module is coupled to a first bit line in a second memory section, and the first bit line in the second memory section is coupled to a second bit line in the second memory section via a second conducting line; and data stored in a first memory cell of the first memory section is propagated from the first bit line in the first memory section to the second bit line in the first memory section through the first conducting line, the data is propagated from the second bit line in the first memory section to the first bit line in the second memory section through the latch circuitry of the first latch module, and the data is propagated from the first bit line in the second memory section to the second bit line in the second memory section through the second conducting line.

* * * * *